(12) United States Patent
Sorenson

(10) Patent No.: US 8,368,487 B1
(45) Date of Patent: Feb. 5, 2013

(54) THIN-FILM BULK ACOUSTIC RESONATORS HAVING MULTI-AXIS ACOUSTIC WAVE PROPAGATION THEREIN

(75) Inventor: Logan D. Sorenson, Atlanta, GA (US)

(73) Assignee: Integrated Device Technology, Inc., San Jose, CA (US)

(*) Notice: Subject to any disclaimer, the term of this patent is extended or adjusted under 35 U.S.C. 154(b) by 518 days.

(21) Appl. No.: 12/713,940

(22) Filed: Feb. 26, 2010

Related U.S. Application Data

(60) Provisional application No. 61/308,541, filed on Feb. 26, 2010.

(51) Int. Cl.
*H03H 9/15* (2006.01)
*H03H 9/13* (2006.01)
*H03H 9/54* (2006.01)

(52) U.S. Cl. ........ 333/187; 333/186; 333/189; 310/322; 310/351; 310/366; 310/367

(58) Field of Classification Search .......... 333/186–189, 333/193–196; 310/313 B, 313 D, 318, 322, 310/334, 351, 365–367
See application file for complete search history.

(56) References Cited

U.S. PATENT DOCUMENTS

| | | | | |
|---|---|---|---|---|
| 3,753,164 A | * | 8/1973 | De Vries | 333/153 |
| 3,883,831 A | * | 5/1975 | Williamson et al. | 333/153 |
| 4,013,983 A | * | 3/1977 | Hartemann | 333/195 |
| 4,055,820 A | * | 10/1977 | Solie | 333/153 |
| 5,129,262 A | * | 7/1992 | White et al. | 73/599 |
| 6,984,332 B2 | * | 1/2006 | Varadan et al. | 216/2 |
| 7,728,483 B2 | * | 6/2010 | Tanaka | 310/313 R |
| 7,898,158 B1 | * | 3/2011 | Li et al. | 310/351 |
| 7,924,119 B1 | * | 4/2011 | Ayazi et al. | 333/186 |
| 8,143,681 B2 | * | 3/2012 | Zaghloul et al. | 257/416 |
| 2008/0079515 A1 | * | 4/2008 | Ayazi et al. | 333/187 |

OTHER PUBLICATIONS

Lee et al., "Study of lateral mode SOI-MEMS resonators for reduced anchor loss", Journal of Micromechanics and Microengineering; J. Micormech, Microeng. 21 (2011) 045010 (10pp); 2011 IOP Publishing Ltd., USA. http://iopscience.iop.org/0960-1317/21/4/045010.

Piazza et al. "Piezoelectric Aluminum Nitride Vibrating Contour-Mode MEMS Resonators", Journal of Microelectromechanical Systems, vol. 15, No. 6, Dec. 2006; IEEE; pp. 1406-1418.

Wang et al., "1.51 GHz Nanocrystalline Diamond Micromechanical Disk Resonator with Material-Mismatched Isolating Support"; Center for Integrated Wireless Microsystems (WIMS), Dept. of EECS, University of Michigan, Ann Arbor, MI USA; 2004 IEEE, pp. 641-644.

* cited by examiner

*Primary Examiner* — Barbara Summons
(74) *Attorney, Agent, or Firm* — Myers Bigel, et al.

(57) ABSTRACT

Microelectromechanical resonators include a resonator body anchored to a surrounding substrate by at least one support that holds the resonator body opposite a recess in the substrate. The resonator body has first and second pluralities of interdigitated drive and sense electrodes thereon. The first plurality of interdigitated drive and second electrodes are aligned to a first axis of acoustic wave propagation in the resonator body when the resonator body is operating at resonance. In contrast, the second plurality of interdigitated drive and sense electrodes are aligned to a second axis of acoustic wave propagation in the resonator body. This second axis of acoustic wave propagation preferably extends at an angle in a range from 60° to 120° relative to the first axis and, more preferably, at an angle of 90° relative to the first axis. The resonator body may also be configured to have a first side that is oriented at a 45° angle relative to the first axis of acoustic wave propagation and oriented at a 45° angle relative to the second axis of acoustic wave propagation.

11 Claims, 6 Drawing Sheets

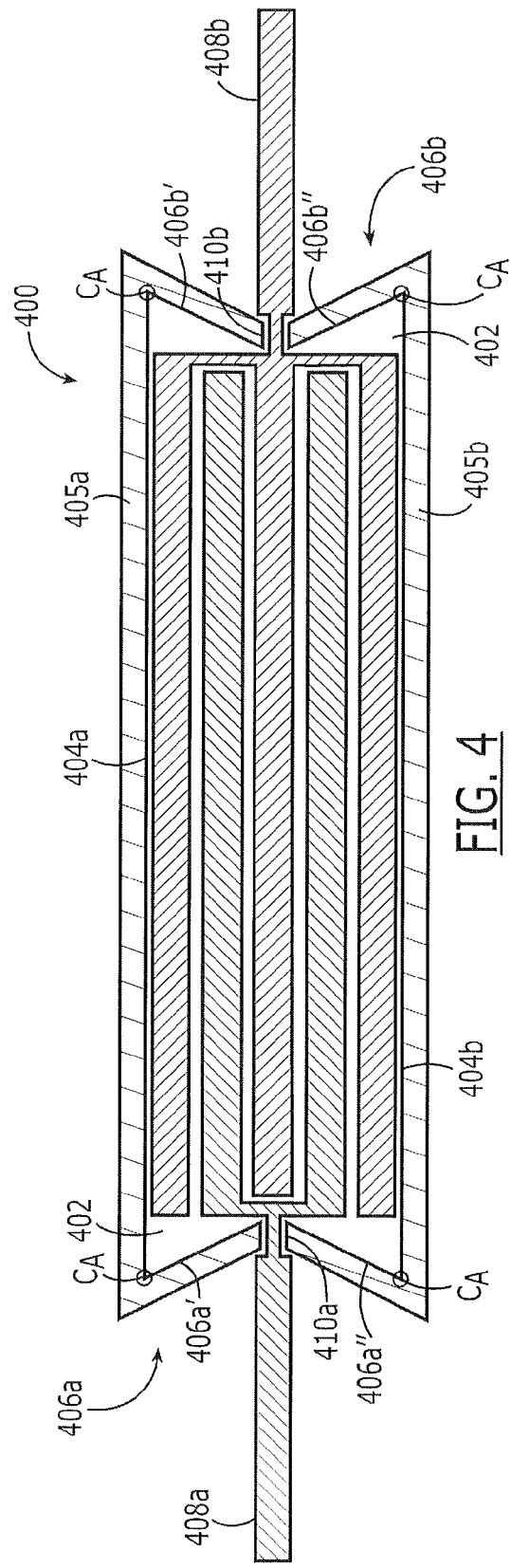

THIN-FILM BULK ACOUSTIC RESONATORS HAVING MULTI-AXIS ACOUSTIC WAVE PROPAGATION THEREIN

REFERENCE TO PRIORITY APPLICATION

This application claims priority to U.S. Provisional Application Ser. No. 61/308,541, filed Feb. 26, 2010, the disclosure of which is hereby incorporated herein by reference.

FIELD OF THE INVENTION

The present invention relates to integrated circuit devices and, more particularly, to micro-electromechanical devices and methods of forming same.

BACKGROUND OF THE INVENTION

The quality factor (Q) of a mechanical resonator is defined as the energy stored in the resonator divided by the energy dissipated per vibration cycle. This means the lower the energy loss, the higher the quality factor. Various loss mechanisms will contribute to energy dissipation within a thin-film bulk acoustic resonator, including anchor loss, surface loss, air damping and thermoplastic damping. For a thin-film piezoelectric-on-substrate (TPoS) resonator, the loss mechanisms can be from the surface loss associated with the electrode and the piezoelectric layers, the energy dissipated from the resonator to the supporting substrate, and the air damping loss when the device is operated in air.

Anchor loss or support damping is one of the significant energy loss mechanisms. While the resonator vibrates, the harmonic load excites acoustic waves propagating in support beams, which anchor the resonator to its surrounding substrate, and part of the vibration energy is dissipated through elastic wave propagation into the surrounding substrate. One technique to reduce this "anchor" loss includes placing support beams at nodal points where minimum vibration or displacement is present. An example of this technique is disclosed in article by R. Abdolvand et al., entitled "A Low-Voltage Temperature-Stable Micromechanical Piezoelectric Oscillator," Proceedings of the 14$^{th}$ International Conference on Solid-State Sensors, Actuators and Microsystems, Lyon, France, Jun. 10-14 (2007), pp. 53-56. Another technique for reducing "anchor" loss, which includes using perforated resonator body supports, is disclosed in commonly assigned U.S. application Ser. No. 12/508,257, filed Jul. 23, 2009, entitled "Thin-Film Bulk Acoustic Resonators Having Perforated Resonator Body Supports That Enhance Quality Factor," the disclosure of which is hereby incorporated herein by reference.

SUMMARY OF THE INVENTION

Microelectromechanical resonators according to some embodiments of the invention can be operated in a bulk acoustic mode of operation and can exploit the self-focusing properties of silicon crystal material. These resonators include a resonator body that is anchored to a surrounding substrate by at least one support that holds the resonator body opposite a recess in the substrate. The resonator body has first and second pluralities of interdigitated drive and sense electrodes thereon. The first plurality of interdigitated drive and second electrodes are aligned to a first axis of acoustic wave propagation in the resonator body when the resonator body is operating at resonance. In contrast, the second plurality of interdigitated drive and sense electrodes are aligned to a second axis of acoustic wave propagation in the resonator body. This second axis of acoustic wave propagation preferably extends at an angle in a range from about 60° to about 120° relative to the first axis and, more preferably, at an angle of 90° relative to the first axis. The resonator body may also be configured to have a first side that is oriented at a 45° angle relative to the first axis of acoustic wave propagation and oriented at a 45° angle relative to the second axis of acoustic wave propagation, so that a 90° can be achieved between the first axis and the second axis. In addition, for those embodiments where the resonator body is anchored to a substrate by a pair of supports, each of the supports may have a first side coplanar with the first side of the resonator body.

Thus, the resonator body, which is configured to support a standing acoustic wave therein at resonance, can use the first side thereon to reflect a standing acoustic wave propagating between the first and second axes. In particular, this first side of the resonator body can be exposed to the ambient in the recess so that reflection of acoustic waves propagating within the resonator body can occur at a body-ambient interface. This reflection can be modeled generally using an acoustic version of Snell's law, where the ambient is treated as having a much higher acoustic impedance than the resonator body.

In some additional embodiments of the invention, the pitch between the first plurality of interdigitated drive and sense electrodes is equal to $\lambda/2$ and the pitch between the second plurality of interdigitated drive and second electrodes is equal to $\lambda/2$, where $\lambda$ is the wavelength of the acoustic wave at resonance. The number of drive electrodes in the first plurality of interdigitated drive and sense electrodes may be unequal to the number of sense electrodes in the first plurality of interdigitated drive and sense electrodes. In particular, the number of drive electrodes in the first plurality of interdigitated drive and sense electrodes is equal to a number of sense electrodes in the second plurality of interdigitated drive and sense electrodes, and a number of sense electrodes in the first plurality of interdigitated drive and sense electrodes is equal to a number of drive electrodes in the second plurality of interdigitated drive and sense electrodes.

According to additional embodiments of the invention, a microelectromechanical resonator includes a resonator body that is suspended over a substrate using at least one support that anchors the resonator body to the substrate. A first plurality of interdigitated drive and sense electrodes are provided on the resonator body, adjacent a first end thereof. A second plurality of interdigitated drive and sense electrodes are also provided on the resonator body, adjacent a second end thereof. This second end is separated from the first end by a transition region. This transition region is configured to reflect a standing acoustic wave in the resonator body by an angle in a range between 60° and 120° and, more preferably, at an angle of 90° when the first and second plurality of interdigitated drive and sense electrodes are controlled to induce resonance in the resonator body.

A microelectromechanical resonator according to a further embodiment of the invention includes a resonator body (e.g., semiconductor body), which is suspended opposite a substrate by a pair of anchors. The pair of anchors extend outward from first and second opposing sides of the resonator body. In order to suppress spurious modes during resonance, the resonator body is formed to have acute-angle corners at intersections between first and second opposing ends of the resonator body and the first and second opposing sides. A plurality of interdigitated input and output electrodes are provided on the resonator body. Each of these input and output electrodes extends on a respective one of the pair of anchors. According to additional aspects of these embodiments of the invention, the pair of anchors are aligned to a longitudinal axis of the resonator body, which is spaced midway between the first and second opposing ends. The first and second opposing sides of the resonator body intersect with corresponding ones of the first and second opposing ends of the resonator body at angles of less than about 85 degrees and, more preferably, at angle of less than about 75 degrees. According to some of these embodiments of the invention, the first and second opposing ends of the resonator body extend parallel to each other. In addition, the first and second opposing sides of the resonator body include a respective pair of side segments that are mirror images of each other relative to the longitudinal axis.

BRIEF DESCRIPTION OF THE DRAWINGS

FIG. 4 is a plan view of a microelectromechanical resonator having acute-angle corners, according to an embodiment of the present invention.

Figure 1A:
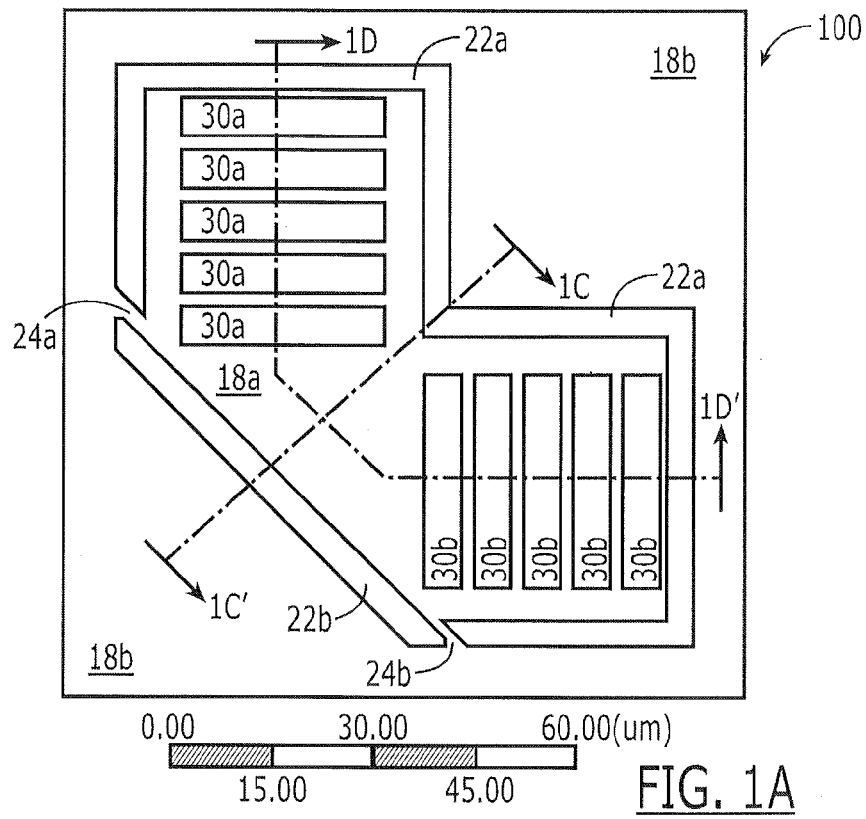
FIG. 1A is a plan view of a microelectromechanical resonator according to embodiments of the invention.

DESCRIPTION OF PREFERRED
EMBODIMENTS

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring now to FIGS. 1A-1D, a microelectromechanical resonator 100 according to an embodiment of the invention is illustrated as including a resonator body 14a having a first plurality of interdigitated drive and sense electrodes 30a aligned to a first axis (A) of acoustic wave propagation in the resonator body 14a and a second plurality of interdigitated drive and sense electrodes 30b aligned to a second axis (A') of acoustic wave propagation in the resonator body 14a. The first axis (A) may be orthogonal to the second axis (A'). In particular, a first side 45 of the resonator body 14a at an air-semiconductor interface may be oriented at a 45° angle relative to the first axis (A) of acoustic wave propagation and at a 45° angle relative to the second axis (A') of acoustic wave propagation. This 45° angle supports a highest degree of reflection of acoustic energy between acoustic waves traveling along the first axis A and the second axis A'. According to alternative embodiments of the invention, an angle between the first axis A and the second axis A' may be set in a range from about 60° to about 120°. For example, depending on the crystallographic orientation of the material (e.g., semiconductor) within the resonator body 14a, the first and second axes may need to be separated by angles other than 90° in order to maximize efficiency of acoustic wave propagation within the body 14a.

Figure 1B:
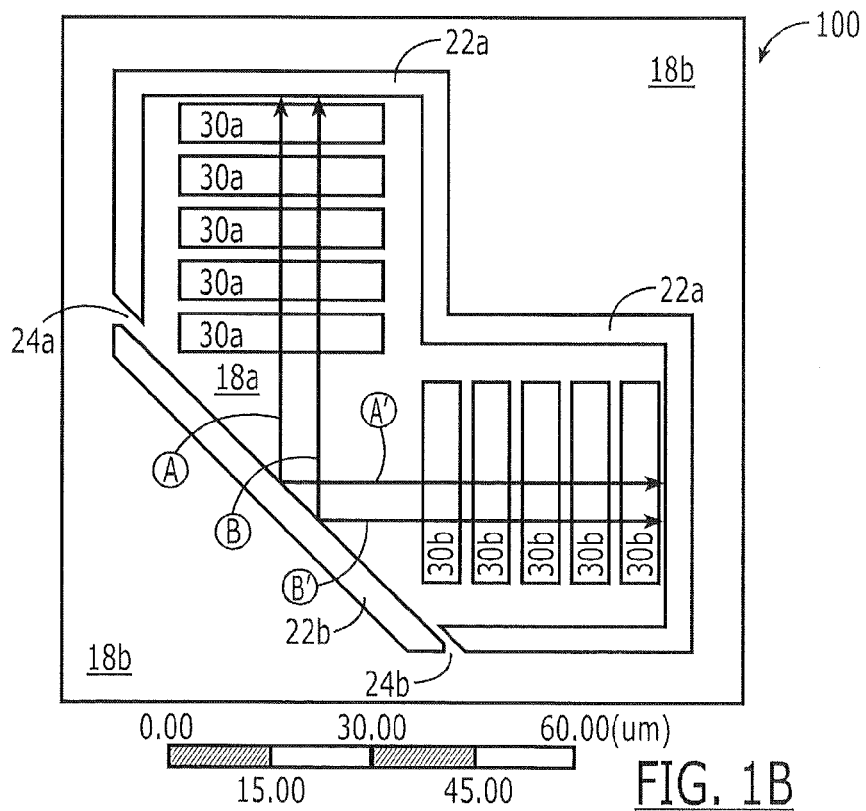
FIG. 1B is a plan view of the microelectromechanical resonator of FIG. 1A, which illustrates equivalent acoustic path lengths for acoustic waves in a resonator body during resonance.

Moreover, as illustrated by FIG. 1B, the combined length of the offset wave propagation paths B and B' equals the combined length of the first axis A and the second axis B. Accordingly, when the resonator 100 is operating at its resonant frequency, the length of a standing acoustic wave propagating along paths B, B' is equivalent to the length of a standing acoustic wave propagating along paths A, A'.

As shown by FIGS. 1A-1B, the resonator body 14a is anchored to a surrounding substrate by a pair of supporting anchors 24a, 24b, which may be aligned with the first side 45 of the resonator body 14a. These anchors 24a, 24b are defined during a step to pattern the resonator body 14a by etching trenches 22a, 22b through at least the resonator body layer 14a, 14b. Alternatively, a single anchor may be provided at a corner of the resonator body 14a extending diametrically opposite the first side 45.

Figure 1C:
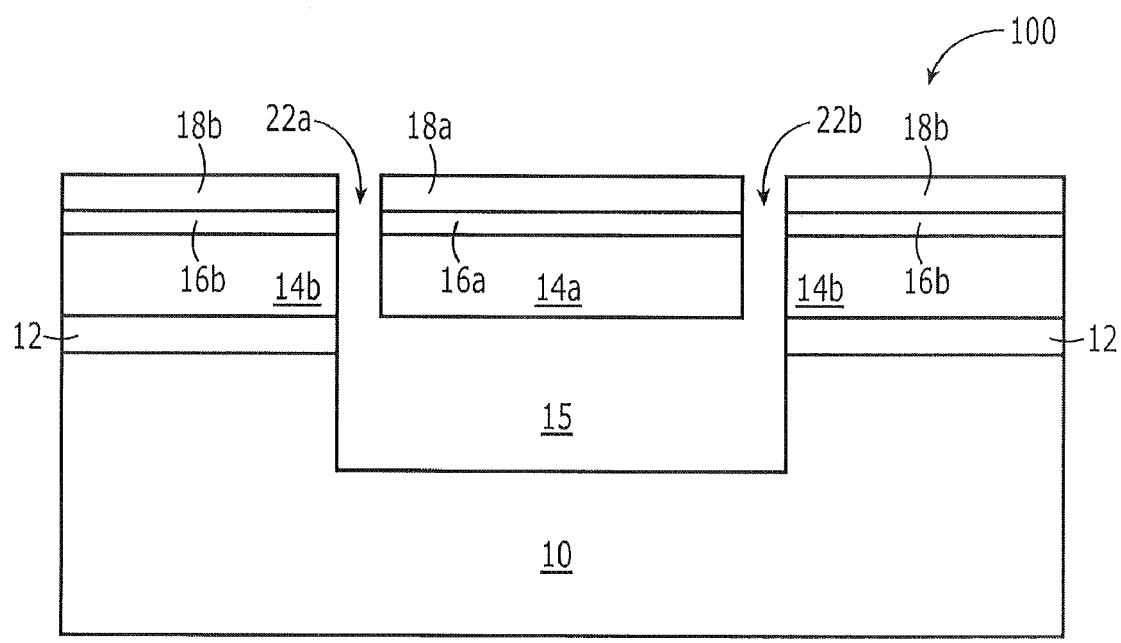
FIG. 1C is a cross-sectional view of the microelectromechanical resonator of FIG. 1A, taken along line 1C-1C'.
Figure 1D:
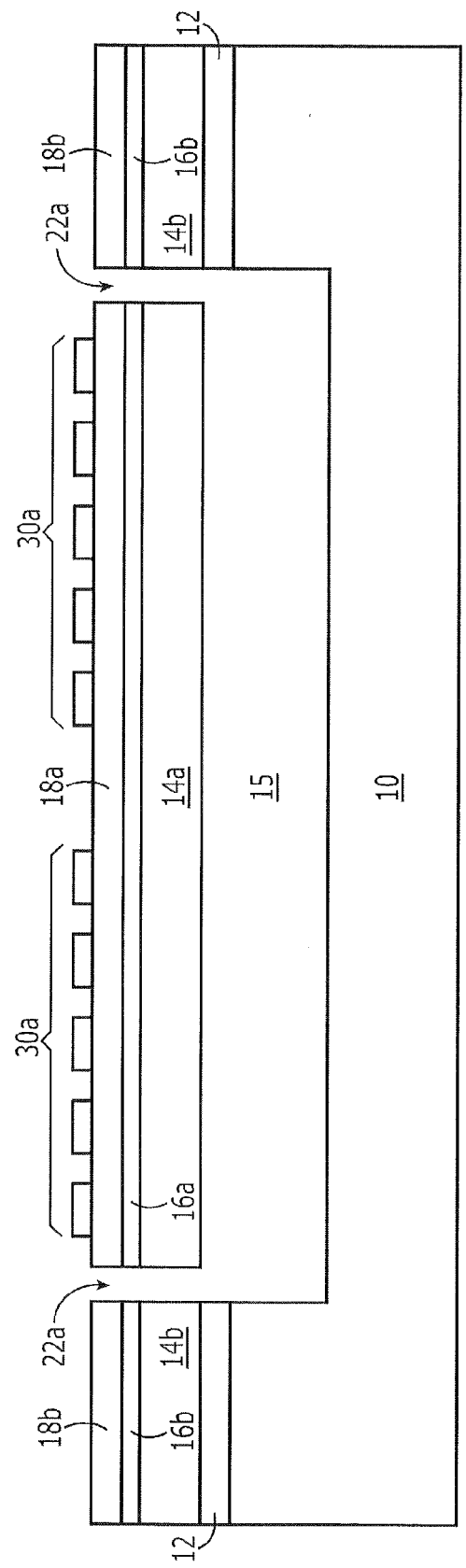
FIG. 1D is a cross-sectional view of the microelectromechanical resonator of FIG. 1A, taken along line 1D-1D'.

As illustrated by the cross-sectional views of FIGS. 1C-1D, one embodiment of the surrounding substrate is illustrated as including an underlying support substrate 10 having a recess 15 therein, an insulating layer 12 on the support substrate 10 and a piezoelectric layer 14b on the insulating layer 12. A composite of a lower electrode layer 16a, 16b and a piezoelectric layer 18a, 18b is also provided on the resonator body layer 14a, 14b. In some embodiments of the invention, the support substrate 10 may include a semiconductor layer, the insulating layer 12 may include a silicon dioxide layer, and the piezoelectric layer 18a, 18b may include an aluminum nitride layer.

Figure 2A:
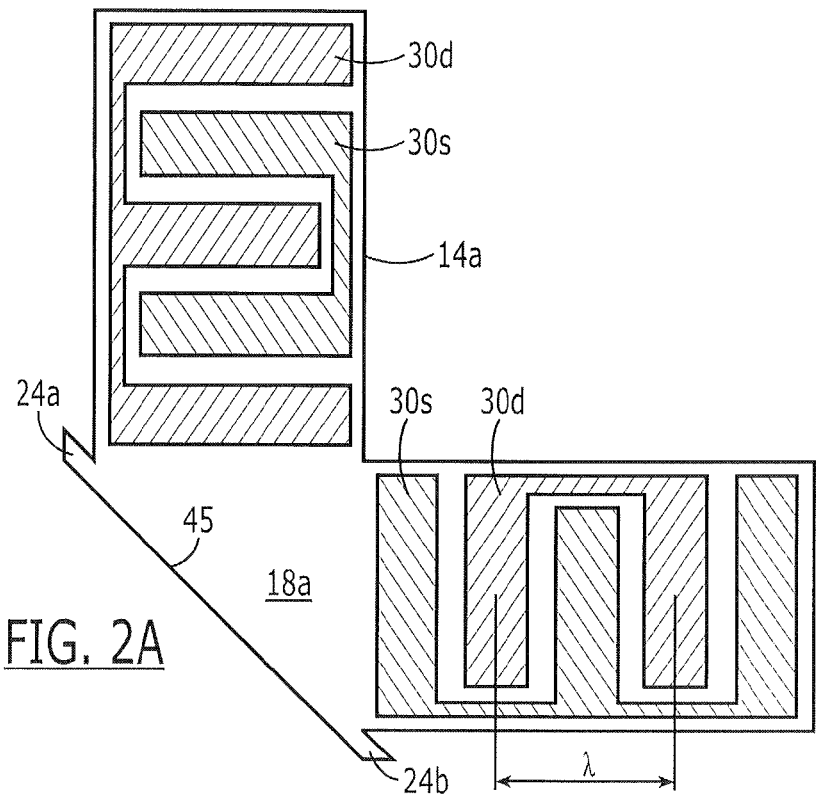
FIG. 2A is a plan view of the resonator body of FIG. 1A with a first configuration of drive and sense electrodes according to embodiments of the invention.
Figure 2B:
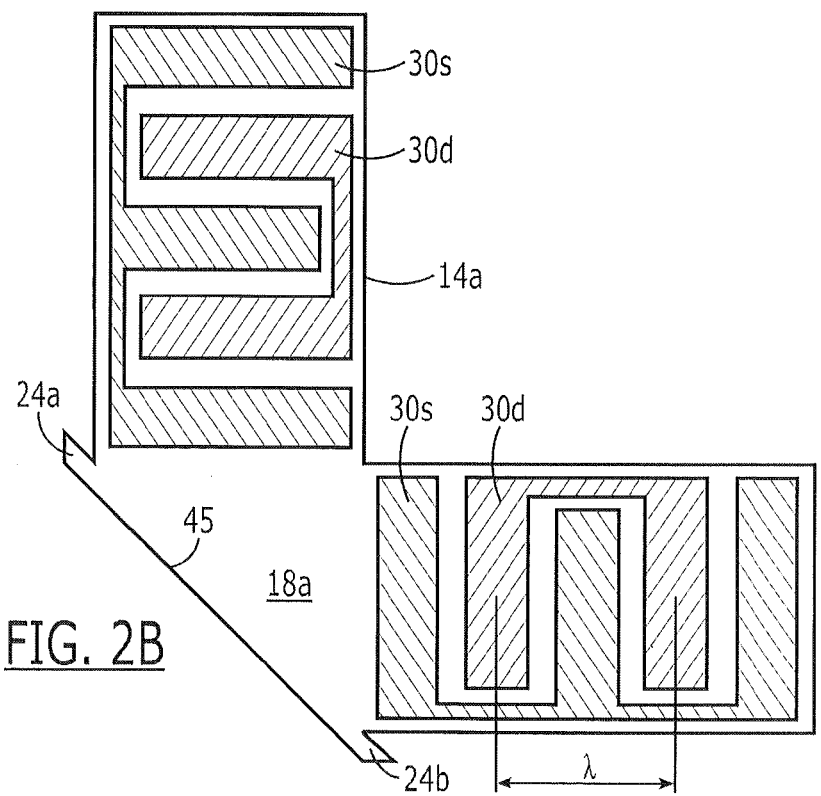
FIG. 2B is a plan view of the resonator body of FIG. 1A with a second configuration of drive and sense electrodes according to embodiments of the invention.
Figure 2C:
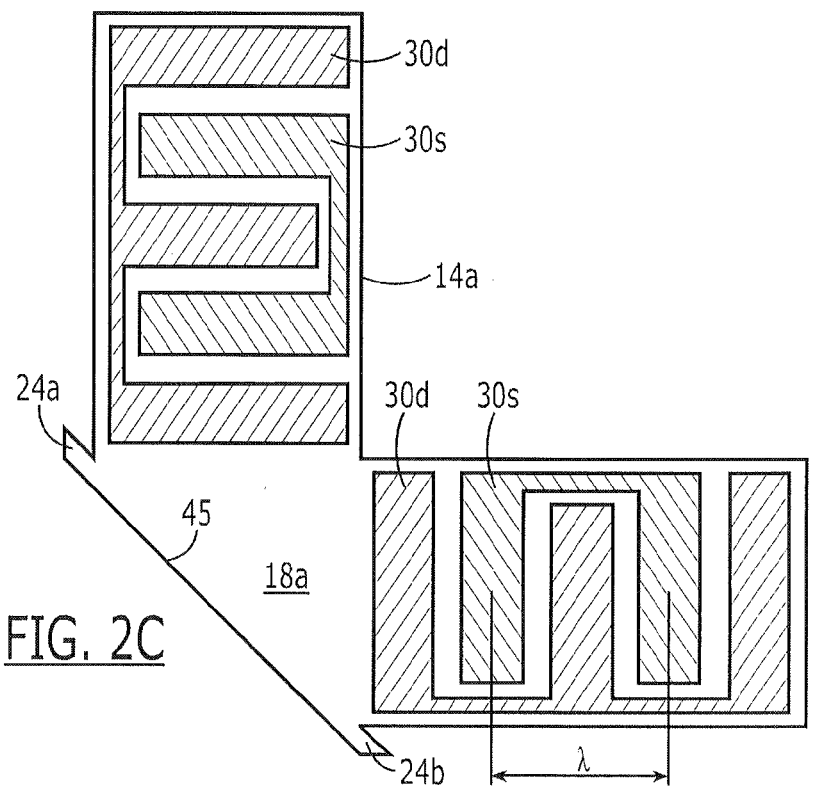
FIG. 2C is a plan view of the resonator body of FIG. 1A with a third configuration of drive and sense electrodes according to embodiments of the invention.
Figure 3:
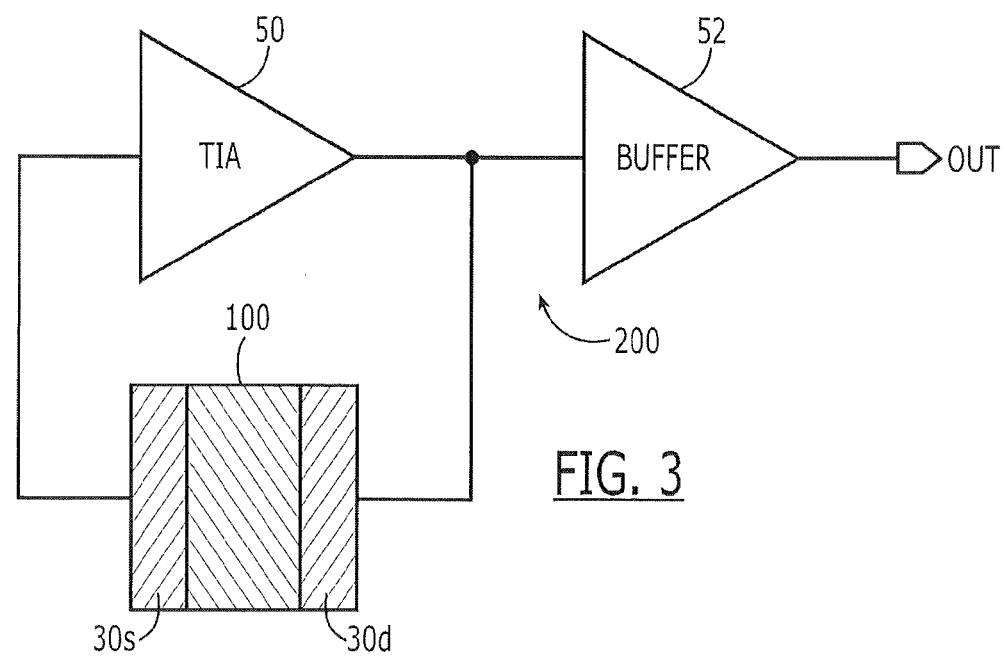
FIG. 3 is an electrical schematic of an oscillator circuit including the microelectromechanical resonator of FIG. 1A.

As illustrated by FIGS. 2A-2C, the first plurality of interdigitated drive and sense electrodes 30a and the second plurality of interdigitated drive and sense electrodes 30b highlighted by FIGS. 1A-1B may be interconnected to provide resonator drive (input) and sense (output) electrode operations. For example, FIG. 2A illustrates a suspended resonator body 14a having a three-finger and two-finger drive electrode and a two-finger and three-finger sense electrode 30s. In contrast, FIG. 2B illustrates a suspended resonator body 14a having a drive electrode 30d containing two two-finger segments and a sense electrode 30s having two three-finger segments. Alternatively, FIG. 2C illustrates a suspended resonator body 14a having a drive electrode 30d containing two three-finger segments and a sense electrode 30s having two two-finger segments. In all of these embodiments, a pitch between adjacent fingers of the drive and sense electrodes is equal to λ/2, where λ is the wavelength of a standing acoustic wave within the resonator body 14a at resonance. These resonator body embodiments of FIGS. 1A-1D and 2A-2C may be utilized within the oscillator circuit 200 of FIG. 3. This oscillator circuit 200 includes a resonator 100 having drive and sense electrodes 30d, 30s, respectively, which are connected to corresponding output and input terminals of a trans-impedance amplifier 50 (TIA). As illustrated by FIG. 3, this amplifier 50 is configured to drive a buffer 52, which generates an output signal OUT. Other examples of oscillator circuits that may utilize the resonator 100 of FIGS. 1A-1D and 2A-2C are disclosed in U.S. application Ser. No. 12/570,592, filed Sep. 30, 2009, the disclosure of which is hereby incorporated herein by reference.

FIG. 4 is a plan view of a microelectromechanical resonator 400 according to an embodiment of the invention that has acute-angle corners $C_A$ that define a shape of a suspended resonator body 402 and operate to suppress spurious modes during resonance. According to some of these embodiments of the invention, the acute angles at the corners are less than about 85 degrees and, more preferably, less than about 75 degrees. These acute-angle corners $C_A$ are provided at intersections between first and second opposing ends 404a, 404b of the resonator body 402 and the first and second opposing sides 406a, 406b. A plurality of interdigitated input and output electrodes 408a, 408b are provided on the resonator body 402, as illustrated.

The resonator body 402 is attached to a supporting substrate 412 by a pair of opposing anchors 410a, 410b, which are aligned to a longitudinal axis (e.g., centerline) of the resonator body 402 that is spaced midway between the first and second opposing ends 404a, 404b. In addition, the first side 406a of the resonator body 402 includes a first pair of side segments 406a', 406a" that are patterned as mirror images of each other relative to the longitudinal axis. Similarly, the second side 406b of the resonator body 402 includes a second pair of side segments 406b', 406b" that are patterned as mirror images of each other relative to the longitudinal axis. The first and second opposing ends 404a, 404b and the first and second opposing sides 406a, 406b are defined by a pair of through-body trenches 405a, 405b that expose an underlying recess.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A microelectromechanical resonator, comprising:
   a resonator body having a first plurality of interdigitated drive and sense electrodes aligned to a first axis of acoustic wave propagation in said resonator body and a second plurality of interdigitated drive and sense electrodes aligned to a second axis of acoustic wave propagation in said resonator body that is orthogonal to the first axis.

2. The microelectromechanical resonator of claim 1, wherein said resonator body is anchored to a substrate by at least one support.

3. The microelectromechanical resonator of claim 2, wherein said resonator body is suspended opposite a recess in the substrate.

4. The microelectromechanical resonator of claim 1, wherein said resonator body has a first side oriented at a 45° angle relative to the first axis of acoustic wave propagation.

5. The microelectromechanical resonator of claim 4, wherein the first side of said resonator body is oriented at a 45° angle relative to the second axis of acoustic wave propagation.

6. The microelectromechanical resonator of claim 5, wherein said resonator body is anchored to a substrate by a pair of supports; and wherein each of the supports has a first side coplanar with the first side of said resonator body.

7. The microelectromechanical resonator of claim 5, wherein said resonator body is configured to support a standing acoustic wave therein at resonance; and wherein the standing acoustic wave reflects off the first side of said resonator body when propagating along the first axis.

8. The microelectromechanical resonator of claim 7, wherein a pitch between the first plurality of interdigitated drive and sense electrodes is equal to $\lambda/2$, where $\lambda$ is the wavelength of the acoustic wave at resonance.

9. The microelectromechanical resonator of claim 8, wherein a number of drive electrodes in the first plurality of interdigitated drive and sense electrodes is unequal to a number of sense electrodes in the first plurality of interdigitated drive and sense electrodes.

10. The microelectromechanical resonator of claim 9, wherein a number of drive electrodes in the first plurality of interdigitated drive and sense electrodes is equal to a number of sense electrodes in the second plurality of interdigitated drive and sense electrodes; and wherein a number of sense electrodes in the first plurality of interdigitated drive and sense electrodes is equal to a number of drive electrodes in the second plurality of interdigitated drive and sense electrodes.

11. A microelectromechanical resonator, comprising:
a resonator body having a first plurality of interdigitated drive and sense electrodes aligned to a first axis of acoustic wave propagation in said resonator body and a second plurality of interdigitated drive and sense electrodes aligned to a second axis of acoustic wave propagation in said resonator body that extends at an angle in a range from 60° to 120° relative to the first axis.

* * * * *